(12) United States Patent
Chen

(10) Patent No.: US 10,009,029 B1
(45) Date of Patent: Jun. 26, 2018

(54) INTERFACE CONTROL CIRCUIT TO MATCH VOLTAGE LEVELS BETWEEN USB DEVICES UPON CONNECTION

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Chun-Sheng Chen, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days. days.

(21) Appl. No.: 15/662,070

(22) Filed: Jul. 27, 2017

(30) Foreign Application Priority Data

Mar. 22, 2017 (CN) .......................... 2017 1 0172570

(51) Int. Cl.
*H03K 19/0185* (2006.01)
*G06F 1/26* (2006.01)
*G06F 13/40* (2006.01)
*G06F 13/42* (2006.01)
*G06F 1/16* (2006.01)
*G06F 1/32* (2006.01)
*G06F 13/38* (2006.01)

(52) U.S. Cl.
CPC ... *H03K 19/018521* (2013.01); *G06F 1/1613* (2013.01); *G06F 1/26* (2013.01); *G06F 1/266* (2013.01); *G06F 1/3287* (2013.01); *G06F 13/385* (2013.01); *G06F 13/4022* (2013.01); *G06F 13/4282* (2013.01); *G06F 2213/0042* (2013.01)

(58) Field of Classification Search
CPC .......... G06F 2213/0042; G06F 1/3287; G06F 1/1635; G06F 1/28; G06F 11/3051; G06F 13/382; G06F 13/4282; H03K 19/018521
See application file for complete search history.

(56) References Cited

U.S. PATENT DOCUMENTS

| 9,331,492 B2* | 5/2016 | Lin ........................... H02J 4/00 |
| 9,606,953 B2* | 3/2017 | Talmola .............. G06F 13/4081 |
| 9,804,651 B2* | 10/2017 | Jhong ..................... G06F 1/266 |
| 2013/0303914 A1* | 11/2013 | Hiltner ..................... A61B 8/12 600/449 |
| 2015/0143138 A1* | 5/2015 | Chang ................... G06F 13/385 713/300 |
| 2015/0280369 A1* | 10/2015 | Chen .................... H01R 13/703 439/188 |
| 2016/0004287 A1* | 1/2016 | Qiu ........................ H01R 24/62 713/300 |
| 2017/0222378 A1* | 8/2017 | Netsu ..................... H01R 24/64 |
| 2017/0250507 A1* | 8/2017 | Harashima ............ H01R 24/60 |

(Continued)

*Primary Examiner* — Vibol Tan
(74) *Attorney, Agent, or Firm* — ScienBiziP, P.C.

(57) ABSTRACT

An interface control circuit to apply a compatible voltage for a USB device upon connection includes a USB connector, a controlling module, and a switching module. The USB connector outputs the plug signal when connected to the USB device. The controlling module outputs a power supply signal when the plug signal is received. The switching module outputs a power supply drive signal when the power supply signal is received.

20 Claims, 3 Drawing Sheets

(56) References Cited

U.S. PATENT DOCUMENTS

2017/0293335 A1* 10/2017 Dunstan .................. G06F 1/266
2017/0315945 A1* 11/2017 Wang .................... G06F 13/385
2017/0357803 A1* 12/2017 Amarilio ............... G06F 21/552

* cited by examiner

INTERFACE CONTROL CIRCUIT TO MATCH VOLTAGE LEVELS BETWEEN USB DEVICES UPON CONNECTION

FIELD

The subject matter herein generally relates to interface control circuit.

BACKGROUND

To respond to the insertion of external universal serial bus (USB) devices at any time, a Type-C interface controller needs to monitor the voltage level of the detection pin of the Type-C connector in real time. When a USB device is connected, the Type-C interface controller needs to communicate with it according to the USB Type-C protocol.

BRIEF DESCRIPTION OF THE DRAWINGS

Implementations of the present technology will now be described, by way of example only, with reference to the attached figures.

DETAILED DESCRIPTION

Figure 1:
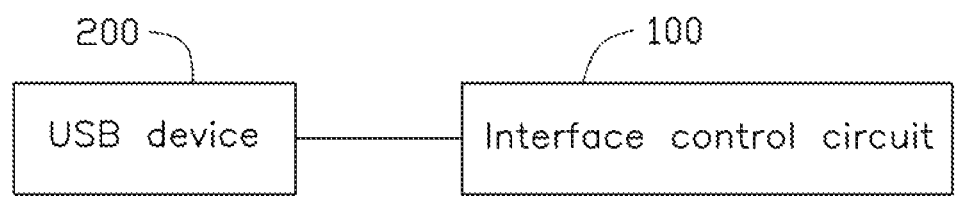
FIG. 1 is a schematic diagram of an exemplary embodiment of an interface control circuit with a universal serial bus (USB) device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 2:
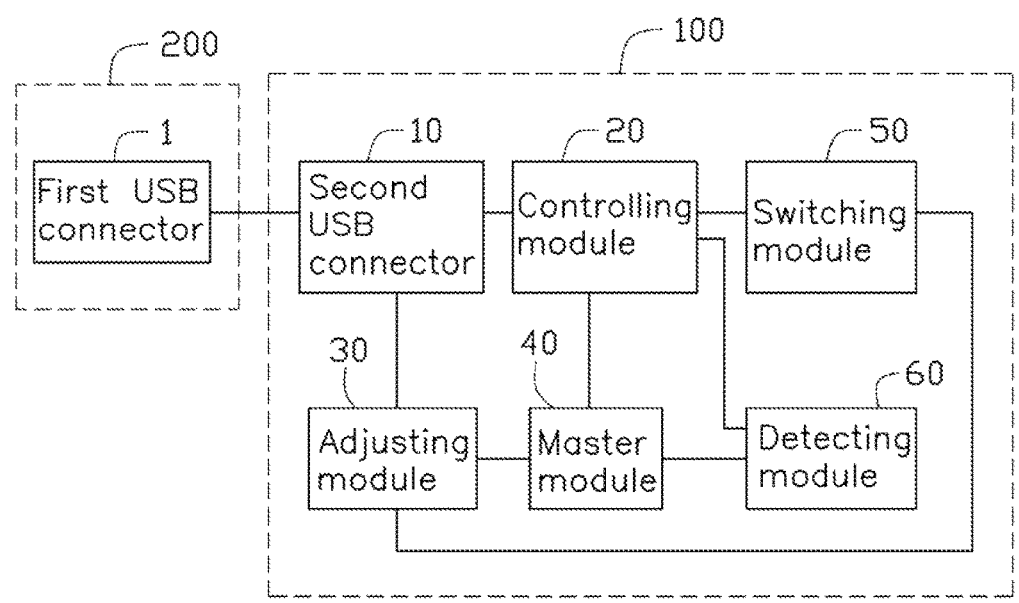
FIG. 2 is a schematic diagram of a more detailed exemplary embodiment of the interface control circuit of FIG. 1.

FIGS. 1 and 2 illustrate an interface control circuit 100 of an exemplary embodiment. The interface control circuit 100 is electrically coupled to a universal serial bus (USB) device 200. The USB device 200 supports the USB 3.0 specification. The USB device 200 comprises a first USB connector 1.

The interface control circuit 100 comprises a second USB connector 10, a controlling module 20, an adjusting module 30, a master module 40, a switching module 50, and a detecting module 60.

The controlling module 20 is electrically coupled to the second USB connector 10. The adjusting module 30 is electrically coupled to the second connector 10. The switching module 50 is electrically coupled between the controlling module 20 and the adjusting module 30. The master module 40 is electrically coupled between the controlling module 20 and the adjusting module 30. The detecting module 60 is electrically coupled between the controlling module 20 and the master module 40.

The first USB connector 1 and the second USB connector 10 are Type-C connectors. The first USB connector 1 and the second USB connector 10 enable the USB device 200 to be electrically connected to the interface control circuit 100.

When the first USB connector 1 and the second USB connector 10 are connected, the second USB connector 10 outputs a plug signal.

The controlling module 20 receives the plug signal from the second USB connector 10, and outputs a power supply signal according to the plug signal.

The adjusting module 30 is configured to enhance the signal received by the second USB connector 10, to avoid distortion of the signal in transmission, and stable signal quality.

The switching module 50 receives the power supply signal from the controlling module 20, and outputs a drive signal to the adjusting module 30 accordingly. The adjusting module 30 receives the drive signal from the switching module 50 to operate normally.

The detecting module 60 detects the magnitude of the current of the power supply signal outputted from the controlling module 20. The master module 40 determines whether or not overcurrent protection is required according to the magnitude.

In the illustrated exemplary embodiment, the controlling module 20 outputs the power supply signal to power supply for the USB device 200.

When the adjusting module 30 operates normally, the master module 40 detects the plugged state of USB device 200 through the adjusting module 30, and identifies the USB device 200.

When the adjusting module 30 is operating abnormally, the master module 40 does not detect the plugged state of USB device 200 through the adjusting module 30.

The adjusting module 30 is configured to stop operating if the drive signal is not received.

Figure 3:
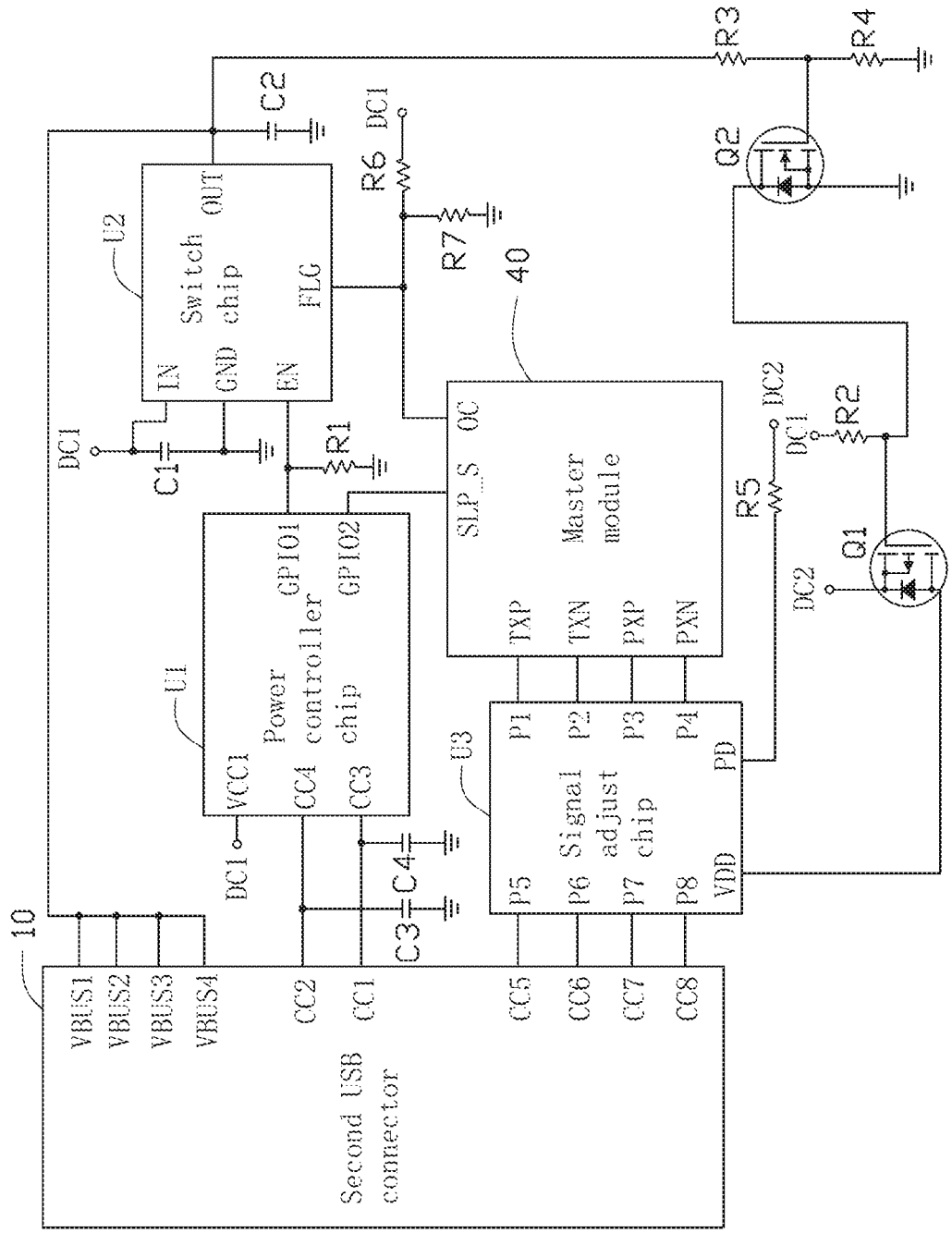
FIG. 3 is a circuit diagram of an exemplary embodiment of the interface control circuit of FIG. 1.

The second USB connector 10 comprises a first detect pin CC1 and a second detect pin CC2 (shown in FIG. 3). When the first detect pin CC1 of the second USB connector 10 detects a positive connection between the first USB connector 1 and the second USB connector 10, the first detect pin CC1 of the second USB connector 10 outputs the plug signal. When the second detect pin CC2 of the second USB connector 10 detects a reverse connection between the first USB connector 1 and the second USB connector 10, the second detect pin CC2 of the second USB connector 10 outputs the plug signal.

The controlling module 20 comprises a first control pin GPIO1. When the controlling module 20 receives the plug signal from the second USB connector 10, the first control pin GPIO1 is converted from a logic-low signal to a logic-high signal. The controlling module 20 outputs the power supply signal when the first control pin GPIO1 is at the logic-high signal.

In at least one exemplary embodiment, the drive signal outputted from the switch module 50 is a logic-high signal. The power supply signal outputted from the controlling module 20 is a +5V voltage signal.

The adjusting module 30 does not operate when the drive signal is not received from the switch module 50. The adjusting module 30 operates normally when the adjusting module 30 receives the drive signal from the switch module 50.

FIG. 3 illustrates a circuit diagram of an exemplary embodiment of the interface control circuit 100.

The controlling module 20 comprises a power controller chip U1, a power switch chip U2, three capacitors C1-C4, and a resistor R1. The power controller chip U1 comprises a first power pin VCC1, a first detect pin CC3, a second detect pin CC4, a first control pin GPIO1, and a second control pin GPIO2. The first power pin VCC1 of the power controller chip U1 is electrically coupled to a first power supply DC1, and the first detect pin CC3 of the power controller chip U1 is electrically coupled to a first detect pin of the second USB connector 10. The first detect pin CC3 is grounded through the capacitor C4. The second detect pin CC4 of the power controller chip U1 is electrically coupled to second detect pin of the second USB connector 10, and is grounded through the capacitor C3.

The switch chip U2 comprises an input pin IN, an output pin OUT, a control pin EN, a ground pin GND, and a current detect pin FLG. The input pin IN of the switch chip U2 is electrically coupled to the first power supply DC1, and is grounded through the capacitor C1. The control pin EN of the switch chip U2 is electrically coupled to the second control pin GPIO2 of the power controller chip U1, and is grounded through the resistor R1. The ground pin GND of the switch chip U2 is the ground connection. The output pin OUT of the switch chip U2 is grounded through the capacitor R2. When the switch chip U2 is turned on, the output voltage outputted by the output pin OUT of the switch chip U2 is equal to the voltage of the first power supply DC1, and the output voltage outputted by the output pin OUT of the switch chip U2 can supply power for the USB device 200.

The master module 40 comprises a first signal pin SLP_S, a second signal pin OC, a third signal pin TXP, a fourth signal pin TXN, a fifth signal pin PXP, and a sixth signal pin PXN.

The first signal pin SLP_S of the master module 40 is electrically coupled to the second control pin GPIO2 of the power controller chip U1. The second signal pin OC of the master module 40 is electrically coupled to current detect pin FLG of the switch chip U2. The third signal pin TXP, the fourth signal pin TXN, the fifth signal pin PXP, and the sixth signal pin PXN of the master module 40 are electrically coupled to the adjusting module 30.

The switching module 50 comprises a first electronic switch Q1, a second electronic switch Q2, and three resistors R2, R3 and R4. A control terminal of the first electronic switch Q1 is electrically coupled to the first power supply DC1 through the resistor R2. A first terminal of the first electronic switch Q1 is electrically coupled to a second power supply DC2. A second terminal of the first electronic switch Q1 is electrically coupled to the adjusting module 30. A control terminal of the second electronic switch Q2 is electrically coupled to the output pin OUT of the switch chip U2 through the resistor R3, to receive the power signal, and is grounded through the resistor R4. A first terminal of the second electronic switch Q2 is grounded. A second terminal of the second electronic switch Q2 is electrically coupled to the control terminal of the first electronic switch Q1.

The second USB connector 10 comprises first to fourth communication pins CC5-CC8 and first to fourth power pins VBUS1-VBUS4. The first power pin VBUS1, the second power pin VBUS2, the third power pin VBUS3, and the fourth power pin VBUS4 of the second USB connector 10 are electrically coupled to the output pin OUT of the switch chip U2.

The adjusting module 30 comprises a signal adjust chip U3 and a fifth resistor R5. The signal adjust chip U3 comprises a control pin PD, a second power pin VDD, and first to eighth pins P1-P8. The first pin P1 of the signal adjust chip U3 is electrically coupled to the third signal pin TXP of the master module 40, and the second pin P2 of the signal adjust chip U3 is electrically coupled to the fourth signal pin TXN of the master module 40. The third pin P3 of the signal adjust chip U3 is electrically coupled to fifth signal pin PXP of the master module 40, and the fourth pin P4 of the signal adjust chip U3 is electrically coupled to sixth signal pin PXN of the master module 40. The fifth, sixth, seventh, and eighth pins (P5, P6, P7, and P8) of the signal adjust chip U3 are electrically coupled respectively to the first, second, third, and fourth communication pins (CC5, CC6, CC7, and CC8) of the second USB connector 10. The control pin PD of signal adjust chip U3 is electrically coupled to the first terminal of the fifth resistor R5. A second terminal of the fifth resistor R5 is electrically coupled to the second power supply DC2. The second power pin VDD of the signal adjust chip U3 is electrically coupled to the second terminal of first electronic switch Q1.

The detecting module 60 comprises a sixth resistor R6 and a seventh resistor R7. A first terminal of the sixth resistor R6 is electrically coupled to the first power supply DC1.

A second terminal of the sixth resistor R6 is electrically coupled to current detect pin FLG of the switch chip U2, and is electrically coupled to the second signal pin OC of the master module 40. A first terminal of the seventh resistor R7 is electrically coupled to the second terminal of the sixth resistor R6, and the second terminal of the seventh resistor R7 is grounded.

In at least one exemplary embodiment, the first electronic switch Q1 can be a PMOS field effect transistor (FET), and the second electronic switch Q2 can be a NMOS FET.

In at least one exemplary embodiment, the control terminal of the first electronic switch Q1 can be a gate terminal of the PMOS FET, the first terminal of the first electronic switch Q1 can be a drain terminal of the PMOS FET, and the second terminal of the first electronic switch Q1 can be a source terminal of the PMOS FET.

In at least one exemplary embodiment, the control terminal of the second electronic switch Q2 can be a gate terminal of the NMOS FET, the first terminal of the second electronic switch Q2 can be a drain terminal of the NMOS FET, and the second terminal of the second electronic switch Q2 can be a source terminal of the NMOS FET.

In at least one exemplary embodiment, the first power supply DC1 can be a +5V direct current (DC) power supply, and the second power supply DC2 can be a +3.3V DC power supply.

When the USB device 200 is connected with the second USB connector 10 through the first USB connector 1, the second USB connector 10 outputs the plug signal to the controlling module 20, and the controlling module 20 outputs the power supply signal to the second USB connector 10 and the switching module 50. In the meantime, the controlling module 20 supplies power for the USB device 200.

When the logic level of the control terminal of the second electronic switch Q2 is high, the second electronic switch Q2 is turned on, and the first electronic switch Q1 is turned on. In the meantime, the second power pin VDD of the signal adjust chip U3 is at a logic high level, and the signal adjust chip U3 operates normally. The master module 40 can communicate with the USB device 200 through the signal adjust chip U3.

When the logic level of the control terminal of the second electronic switch Q2 is low, the second electronic switch Q2 is turned off, and the first electronic switch Q1 is turned off. In the meantime, the second power pin VDD of the signal adjust chip U3 is at a logic low level, and the signal adjust chip U3 does not function. The master module 40 thus does not communicate with the USB device 200 through the signal adjust chip U3.

In this way, it is possible to avoid non-identification of USB devices, and reliability and stability of handshake communications are improved.

The exemplary embodiments shown and described above are only examples. Many details are often found in the art such as the other features of interface control circuit. Therefore, many such details are neither shown nor described.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. An interface control circuit comprising:
   a universal serial bus (USB) connector outputting a plug signal when the USB connector is connected with a USB device;
   a controlling module coupling to the USB connector, the controlling module receiving the plug signal and outputting a power supply signal;
   an adjusting module coupling to the USB connector, the adjusting module enhancing signal received by the second USB connector;
   a master module coupling to the controlling module and the adjusting module; and;
   a switching module coupling to the controlling module and the adjusting module, the switching module receiving the power supply signal and outputting a drive signal;
   wherein the USB connector receives the power supply signal from the controlling module, the power supply signal is configured to power for the USB device; and
   wherein the adjusting module receives the drive signal from the switching module and operates normally, the master module detects the plugged state of the USB device through the adjusting module to identify the USB device.

2. The interface control circuit of claim 1, wherein the controlling module comprises a first control pin, when the controlling module receives the plug signal from the second USB connector, the first control pin is converted from a logic-low signal to a logic-high signal; the controlling module outputs the power supply signal when the first control pin is logic-high signal.

3. The interface control circuit of claim 2, wherein the drive signal is a logic-high signal.

4. The interface control circuit of claim 1, wherein the second USB connector comprises a first detect pin and a second detect pin, when the first detect pin of the second USB connector detects the first USB connector and the second USB connector are in the positive plug state, the first detect pin of the second USB connector outputs the plug signal; when the second detect pin of the second USB connector detects the first USB connector and the second USB connector are in the reverse plug state, the second detect pin of the second USB connector outputs the plug signal.

5. The interface control circuit of claim 1, wherein the controlling module comprises a power controller chip and first to second capacitor; the power controller chip comprises a first power pin, a first detect pin, a second detect pin, a second control pin; the first power pin of the power controller chip is electrically coupled to a first power supply, the first detect pin of the power controller chip is electrically coupled to a first detect pin of the second USB connector, and is grounded through the first capacitor; the second detect pin of the power controller chip is electrically coupled to second detect pin of the second USB connector, and is grounded through the second capacitor.

6. The interface control circuit of claim 5, wherein the controlling module further comprises a switch chip, a first resistor, a second resistor, a third capacitor, and a fourth capacitor; the switch chip comprises an input pin, an output pin, a control pin, a ground pin, and a current detect pin; the input pin of the switch chip is electrically coupled to the first power supply, and is grounded through the third capacitor; the control pin of the switch chip is electrically coupled to the second control pin of the power controller chip, and is grounded through the first resistor; the ground pin of the switch chip is grounded; the output pin of the switch chip is grounded through the fourth capacitor, and is electrically coupled to the USB connector and the switching module.

7. The interface control circuit of claim 6, wherein the switching module comprises a first electronic switch and a second resistor, a control terminal of the first electronic switch is electrically coupled to the first power supply through the second resistor; a first terminal of the first electronic switch is electrically coupled to a second power supply; a second terminal of the first electronic switch is electrically coupled to the adjusting module.

8. The interface control circuit of claim 7, wherein the switching module further comprises a second electronic switch, a third resistor, and a fourth resistor; a control terminal of the second electronic switch is electrically coupled to the output pin of the switch chip through the third resistor to receive the power signal, and is grounded through the fourth resistor; a first terminal of the second electronic switch is grounded; a second terminal of the second electronic switch is electrically coupled to the control terminal of the first electronic switch.

9. The interface control circuit of claim 8, wherein the first electronic switch is a P-type metal-oxide-semiconductor field effect transistor (PMOS FET), and the second electronic switch is an N-type MOS FET (NMOS FET).

10. The interface control circuit of claim 9, wherein the control terminal of the first electronic switch is a gate terminal of the PMOS FET, the first terminal of the first electronic switch is a drain terminal of the PMOS FET, and the second terminal of the first electronic switch is a source terminal of the PMOS FET.

11. The interface control circuit of claim 9, wherein the control terminal of the second electronic switch is a gate terminal of the NMOS FET, the first terminal of the second electronic switch is a drain terminal of the NMOS FET, and the second terminal of the second electronic switch is a source terminal of the NMOS FET.

12. The interface control circuit of claim 6, wherein the first power supply is a +5V direct current (DC) power supply, and the second power supply is a +3.3V DC power supply.

13. The interface control circuit of claim 1, wherein the interface control circuit further comprises a detecting module, the detecting module is electrically coupled between the controlling module and the master module, the detecting module detects the magnitude of the current of the power supply signal outputted from the controlling module, and the master module determines whether or not the overcurrent protection is required according to the magnitude of the current of the power supply signal.

14. An interface control circuit comprising:
an universal serial bus (USB) connector outputting a plug signal when the USB connector is connected with a USB device;
a controlling module coupling to the USB connector, the controlling module receiving the plug signal and outputting a power supply signal;
an adjusting module coupling to the USB connector, the adjusting module enhancing signal received by the second USB connector;
a master module coupling to the controlling module and the adjusting module; and;
a switching module coupling to the controlling module and the adjusting module, the switching module receiving the power supply signal and outputting a drive signal;
wherein the controlling module comprises a first control pin, when the controlling module receives the plug signal from the second USB connector, the first control pin is converted from a logic-low signal to a logic-high signal; the controlling module outputs the power supply signal when the first control pin is logic-high signal;
wherein the USB connector receives the power supply signal from the controlling module, the power supply signal is configured to power for the USB device; and
wherein the adjusting module receives the drive signal from the switching module and operates normally, the master module detects the plugged state of USB device 200 through the adjusting module to identify the USB device.

15. The interface control circuit of claim 14, wherein the drive signal is a logic-high signal.

16. The interface control circuit of claim 14, wherein the second USB connector comprises a first detect pin and a second detect pin, when the first detect pin of the second USB connector detects the first USB connector and the second USB connector are in the positive plug state, the first detect pin of the second USB connector outputs the plug signal; when the second detect pin of the second USB connector detects the first USB connector and the second USB connector are in the reverse plug state, the second detect pin of the second USB connector outputs the plug signal.

17. The interface control circuit of claim 14, wherein the controlling module comprises a power controller chip and first to second capacitor; the power controller chip comprises a first power pin, a first detect pin, a second detect pin, and a second control pin; the first power pin of the power controller chip is electrically coupled to a first power supply, the first detect pin of the power controller chip is electrically coupled to a first detect pin of the second USB connector, and is grounded through the first capacitor; the second detect pin of the power controller chip is electrically coupled to second detect pin of the second USB connector, and is grounded through the second capacitor.

18. The interface control circuit of claim 17, wherein the controlling module further comprises a switch chip, a first resistor, a second resistor, a third capacitor, and a fourth capacitor; the switch chip comprises an input pin, an output pin, a control pin, a ground pin, and a current detect pin; the input pin of the switch chip is electrically coupled to the first power supply, and is grounded through the third capacitor; the control pin of the switch chip is electrically coupled to the second control pin of the power controller chip, and is grounded through the first resistor; the ground pin of the switch chip is grounded; the output pin of the switch chip is grounded through the fourth capacitor, and is electrically coupled to the USB connector and the switching module.

19. The interface control circuit of claim 18, wherein the switching module comprises a first electronic switch, a second electronic switch, a second resistor, a third resistor, and a fourth resistor; a control terminal of the first electronic switch is electrically coupled to the first power supply through the second resistor; a first terminal of the first electronic switch is electrically coupled to a second power supply; a second terminal of the first electronic switch is electrically coupled to the adjusting module; a control terminal of the second electronic switch is electrically coupled to the output pin of the switch chip through the third resistor to receive the power signal, and is grounded through the fourth resistor; a first terminal of the second electronic switch is grounded; a second terminal of the second electronic switch is electrically coupled to the control terminal of the first electronic switch.

20. The interface control circuit of claim 19, wherein the first electronic switch is a P-type metal-oxide-semiconductor field effect transistor (PMOS FET), and the second electronic switch is an N-type MOS FET (NMOS FET); the control terminal of the first electronic switch is a gate terminal of the PMOS FET, the first terminal of the first electronic switch is a drain terminal of the PMOS FET, and the second terminal of the first electronic switch is a source terminal of the PMOS FET; the control terminal of the second electronic switch is a gate terminal of the NMOS FET, the first terminal of the second electronic switch is a drain terminal of the NMOS FET, and the second terminal of the second electronic switch is a source terminal of the NMOS FET.

* * * * *